United States Patent
Sakata et al.

(10) Patent No.: US 12,014,946 B2
(45) Date of Patent: Jun. 18, 2024

(54) ELECTROSTATIC CHUCK, VACUUM PROCESSING APPARATUS, AND SUBSTRATE PROCESSING METHOD

(71) Applicant: ULVAC, INC., Chigasaki (JP)

(72) Inventors: Genji Sakata, Chigasaki (JP); Hidekazu Yokoo, Chigasaki (JP)

(73) Assignee: ULVAC, INC., Chigasaki (JP)

( * ) Notice: Subject to any disclaimer, the term of this patent is extended or adjusted under 35 U.S.C. 154(b) by 646 days.

(21) Appl. No.: 17/270,742

(22) PCT Filed: Aug. 8, 2019

(86) PCT No.: PCT/JP2019/031443
§ 371 (c)(1),
(2) Date: Feb. 23, 2021

(87) PCT Pub. No.: WO2020/115952
PCT Pub. Date: Jun. 11, 2020

(65) Prior Publication Data
US 2021/0296154 A1    Sep. 23, 2021

(30) Foreign Application Priority Data
Dec. 5, 2018 (JP) ................ 2018-228266

(51) Int. Cl.
*C23C 16/50* (2006.01)
*C23C 14/48* (2006.01)
(Continued)

(52) U.S. Cl.
CPC .......... *H01L 21/6833* (2013.01); *C23C 14/48* (2013.01); *C23C 14/50* (2013.01); *H01L 21/265* (2013.01)

(58) Field of Classification Search
CPC ............. H01L 21/6833; H01L 21/265; H01L 21/6831; H01L 21/67017; H01L 21/3065;
(Continued)

(56) References Cited

U.S. PATENT DOCUMENTS 5,534,073 A * 7/1996 Kinoshita ............ C23C 16/455
269/21
2006/0037702 A1 * 2/2006 Hayashi ............ H01J 37/32449
156/345.46
(Continued)

FOREIGN PATENT DOCUMENTS

JP          11-6069 A       1/1999
JP      2003-282690 A       10/2003
(Continued)

OTHER PUBLICATIONS

Office Action dated Aug. 21, 2023 in Chinese Application No. 201980056824.1.
(Continued)

*Primary Examiner* — Rudy Zervigon
(74) *Attorney, Agent, or Firm* — Saliwanchik, Lloyd & Eisenschenk

(57) ABSTRACT

[Object] To provide an electrostatic chuck that stably supports a substrate while suppressing a rapid increase in the volume of a gas, a vacuum processing apparatus, and a substrate processing method.
[Solving Means] An electrostatic chuck according to an embodiment of the present invention includes: a chuck plate that has a first surface supporting a substrate and a second surface opposite to the first surface. The chuck plate includes an exhaust passage that exhausts a gas from between the substrate and the first surface, the gas being emitted from the substrate between the substrate and the first surface when the substrate is supported by the first surface.

6 Claims, 7 Drawing Sheets

(51) Int. Cl.
*C23C 14/50* (2006.01)
*H01L 21/683* (2006.01)
*H01L 21/265* (2006.01)

(58) Field of Classification Search
CPC .............. H01L 21/31; H01L 21/67213; H01L 21/6875; H01L 21/68785; C23C 14/48; C23C 14/50; C23C 16/4586; H01J 37/3171
USPC .................. 118/728; 156/345.51; 279/128, 3
See application file for complete search history.

(56) References Cited

U.S. PATENT DOCUMENTS

| | | | |
|---|---|---|---|
| 2008/0239691 A1* | 10/2008 | Miyagawa | H01L 21/67103 165/185 |
| 2009/0235866 A1* | 9/2009 | Kataigi | C23C 16/4586 118/725 |
| 2012/0252220 A1 | 10/2012 | Harada et al. | |
| 2015/0036260 A1* | 2/2015 | Cox | H01L 21/6833 361/234 |
| 2018/0143544 A1* | 5/2018 | Iida | H01L 21/67109 |
| 2018/0261486 A1 | 9/2018 | Anada et al. | |

FOREIGN PATENT DOCUMENTS

| | | |
|---|---|---|
| JP | 2012-216774 A | 11/2012 |
| TW | 201633448 A | 9/2016 |

OTHER PUBLICATIONS

International Search Report dated Oct. 8, 2019 in International Application No. PCT/JP2019/031443.
Office Action dated Aug. 17, 2021 in Japanese Application No. 2020-559708.
Office Action dated Aug. 15, 2022 in Korean Application No. 10-2021-7004823.
Office Action dated May 27, 2021 in Taiwanese Application No. 108130813, along with its English translation.

\* cited by examiner

ELECTROSTATIC CHUCK, VACUUM PROCESSING APPARATUS, AND SUBSTRATE PROCESSING METHOD

CROSS-REFERENCE TO RELATED APPLICATIONS

This application is the U.S. national stage application of International Patent Application No. PCT/JP2019/031443, filed Aug. 8, 2019, which claims the benefit under 35 U.S.C. § 119 of Japanese Application No. 2018-228266, filed Dec. 5, 2018, the disclosures of each of which are incorporated herein by reference in their entirety.

TECHNICAL FIELD

The present invention relates to an electrostatic chuck, a vacuum processing apparatus, and a substrate processing method.

BACKGROUND ART

In the production process of electronic parts, a substrate serving as a base material of the electronic parts is supported by a stage under a reduced pressure atmosphere, and processing such as deposition, etching, and ion implantation is performed on the substrate. The processing is performed while, for example, the substrate is adsorbed to an electrostatic chuck (see, for example, Patent Literature 1).

CITATION LIST

Patent Literature

Patent Literature 1: Japanese Patent Application Laid-open No. 2012-216774

DISCLOSURE OF INVENTION

Technical Problem

However, when the substrate is subjected to processing such as ion implantation while being adsorbed to the electrostatic chuck, the processing warms the substrate and causes gases to accumulate between the electrostatic chuck and the substrate in some cases. If the electrostatic adsorption is released in this state, a rapid increase in the volume of the residual gases can cause the substrate to jump out of the electrostatic chuck.

If such a phenomenon occurs, then there is a possibility that the conveyance of the substrate may be defective or the substrate may be damaged even when the processing is successfully completed.

In view of the circumstances as described above, it is an object of the present invention to provide an electrostatic chuck, a vacuum processing apparatus, and a substrate processing method that suppress the above-mentioned rapid increase in the volume of gases and stably support a substrate.

Solution to Problem

In order to achieve the above-mentioned object, an electrostatic chuck according to an embodiment of the present invention includes: a chuck plate that has a first surface supporting a substrate and a second surface opposite to the first surface. The chuck plate includes an exhaust passage that exhausts a gas from between the substrate and the first surface, the gas being emitted from the substrate between the substrate and the first surface when the substrate is supported by the first surface.

In accordance with such an electrostatic chuck, since an exhaust passage that exhausts a gas from between the substrate and the first surface, the gas being emitted from the substrate between the substrate and the first surface when the substrate is supported by the first surface, is provided, rapid volume expansion of gases is suppressed even if the electrostatic adsorption is released, and the substrate can be inhibited from jumping out of the chuck plate.

In the electrostatic chuck, the exhaust passage may include a groove provided in the first surface and a first through hole that communicates with the groove and passes through from the first surface to the second surface.

In accordance with such an electrostatic chuck, since the exhaust passage includes a groove provided in the first surface and a first through hole that communicates with the groove and passes through from the first surface to the second surface, gases emitted from the substrate are efficiently exhausted to the second surface side through the exhaust passage.

In the electrostatic chuck, the groove may include a plurality of first groove portions that extends from a center of the chuck plate outwardly of the chuck plate, and a plurality of second groove portions that intersects the plurality of first groove portions and is annularly formed around the center of the chuck plate.

In accordance with such an electrostatic chuck, since the groove includes a plurality of first groove portions that extends from a center of the chuck plate outwardly of the chuck plate, and a plurality of second groove portions that is annularly formed, gases emitted from the substrate are efficiently exhausted to the second surface side through the groove.

In the electrostatic chuck, the exhaust passage may include a linear embanked portion provided on the first surface and a first through hole that passes through from the first surface to the second surface.

In accordance with such an electrostatic chuck, since the exhaust passage includes an embanked portion provided on the first surface and a first through hole that passes through from the first surface to the second surface, gases emitted from the substrate are efficiently exhausted to the second surface side through the exhaust passage.

In the electrostatic chuck, the first surface may be provided with a plurality of convex portions and an annular convex portion that surrounds the plurality of convex portions, and a height of the plurality of convex portions from the first surface may be less than or equal to a height of the annular convex portion.

In accordance with such an electrostatic chuck, since the convex-shape embossing is performed on the first surface, gases emitted from the substrate are efficiently exhausted to the second surface side through the first surface and the exhaust passage. In addition, the annular convex portion makes it difficult for gases to leak from between the substrate and the chuck plate.

In the electrostatic chuck, the electrostatic chuck may further include a chuck base that has a third surface and a fourth surface, the third surface facing the second surface of the chuck plate, the fourth surface being opposite to the third surface. The chuck base may be provided with a second through hole that passes through from the third surface to the fourth surface, and the second through hole may be configured to communicate with the first through hole.

In accordance with such an electrostatic chuck, since the chuck base that has a third surface and a fourth surface, the third surface facing the second surface of the chuck plate, the fourth surface being opposite to the third surface, is provided with a second through hole that passes through from the third surface to the fourth surface, gases emitted from the substrate are efficiently exhausted to the fourth surface side through the exhaust passage.

In order to achieve the above-mentioned object, a vacuum processing apparatus according to an embodiment of the present invention includes: a vacuum chamber; the electrostatic chuck; a support stage; and a deposition shieled plate. The support stage is housed in the vacuum chamber and has a fifth surface and a sixth surface, the fifth surface supporting the electrostatic chuck, the sixth surface being opposite to the fifth surface. The deposition shieled plate surrounds the support stage and partitions an inside of the vacuum chamber into a first region and a second region, the electrostatic chuck being disposed in the first region, the support stage being disposed in the second region. The support stage is provided with a different exhaust passage that exhausts the gas guided through the exhaust passage to the second region.

In accordance with such a vacuum processing apparatus, since the gas guided from the exhaust passage is exhausted to the second region, rapid volume expansion of gases is suppressed even if the electrostatic adsorption is released, and the substrate can be inhibited from jumping out of the chuck plate.

In order to achieve the above-mentioned object, a substrate processing method according to an embodiment of the present invention includes: preparing the electrostatic chuck. The substrate is placed on the first surface on which a plurality of convex portions has been formed by convex-shape embossing. A height a height $h_0$ of the plurality of convex portions from the first surface when the substrate is placed on the first surface is adjusted to a height $h_1$ lower than the height $h_0$ by electrostatically adsorbing the substrate to the first surface. Processing is performed on the substrate. By relaxing the electrostatic adsorption, the gas emitted during the processing is exhausted from between the substrate and the first surface.

In accordance with such a substrate processing method, since an exhaust passage that exhausts a gas from between the substrate and the first surface, the gas being emitted from the substrate between the substrate and the first surface when the substrate is supported by the first surface, is provided, rapid volume expansion of gases is suppressed even if the electrostatic adsorption is released, and the substrate can be inhibited from jumping out of the chuck plate.

Advantageous Effects of Invention

As described above, in accordance with the present invention, there are provided an electrostatic chuck, a vacuum processing apparatus, and a substrate processing method that suppress the above-mentioned rapid increase in the volume of gases and stably support a substrate.

MODE(S) FOR CARRYING OUT THE INVENTION

Hereinafter, an embodiment of the present invention will be described with reference to the drawings. In each drawing, XYZ axis coordinates are introduced in some cases. For example, an X-axis direction or a Y-axis direction is an in-plane direction of a chuck plate 10, and a Z-axis direction is a direction perpendicular to the in-plane direction of the chuck plate 10. Further, the same members or members having the same function may be denoted by the same reference symbols, and the description thereof may be appropriately omitted after the description of the members.

Figure 1A:
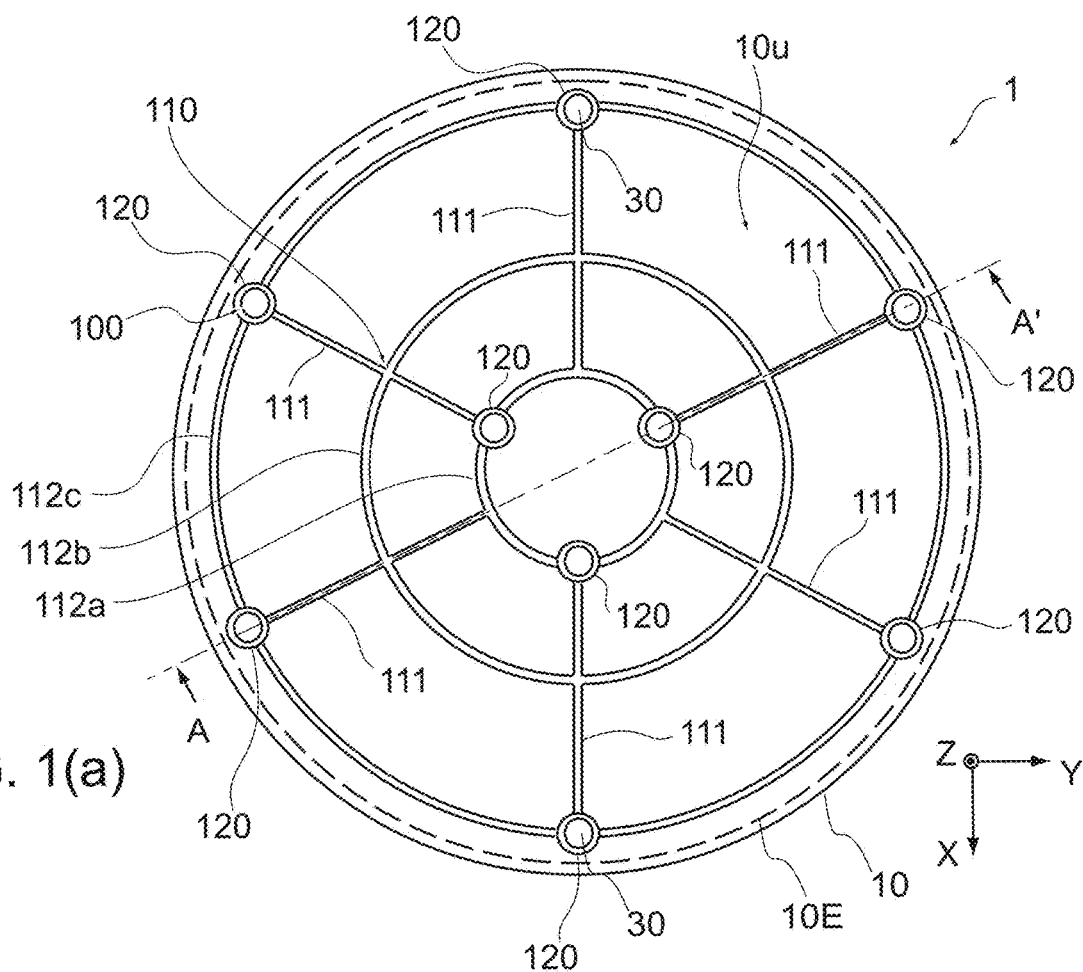
FIG. 1(a) is a schematic plan view of an electrostatic chuck according to this embodiment.
Figure 1B:
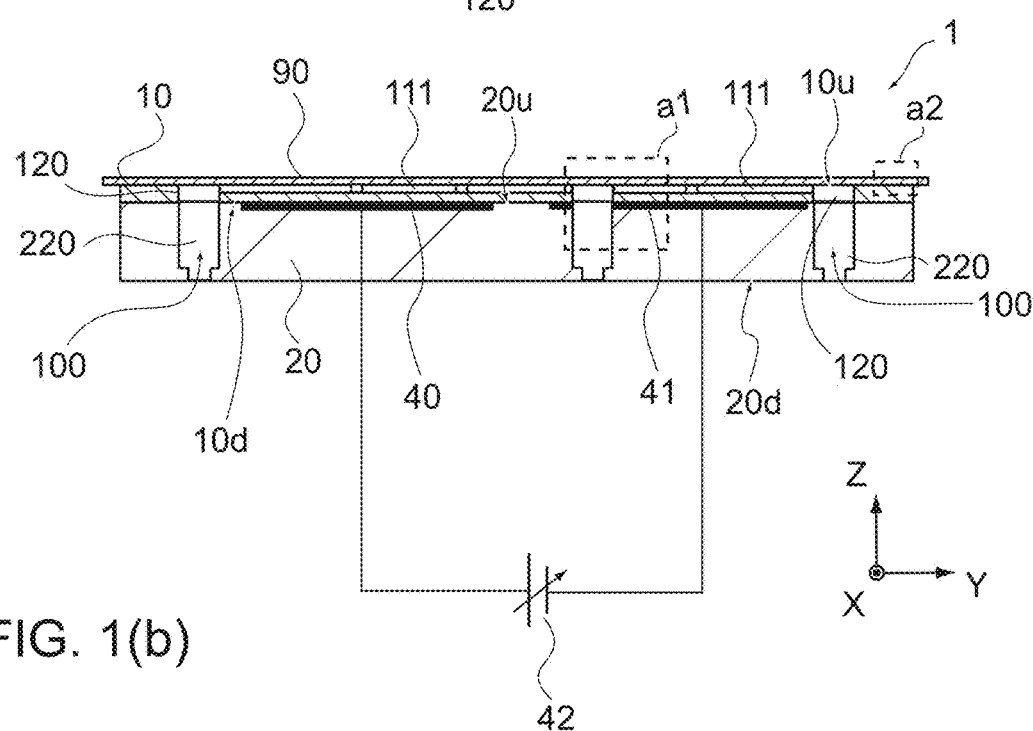
FIG. 1(b) is a schematic cross-sectional view taken along the line A-A' in FIG. 1(a).
Figure 2A:
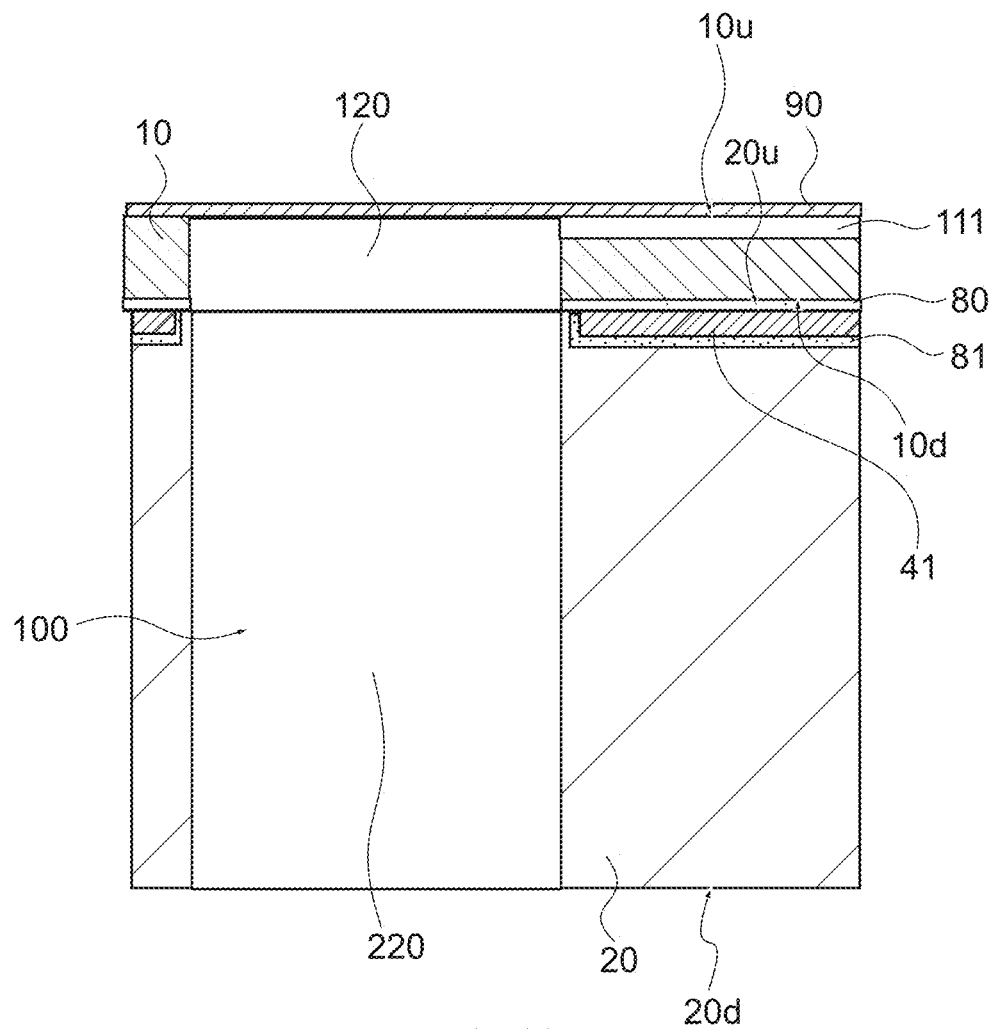
FIG. 2(a) is a schematic cross-sectional view of a region surrounded by a dashed line a1 in FIG. 1(b).
Figure 2B:
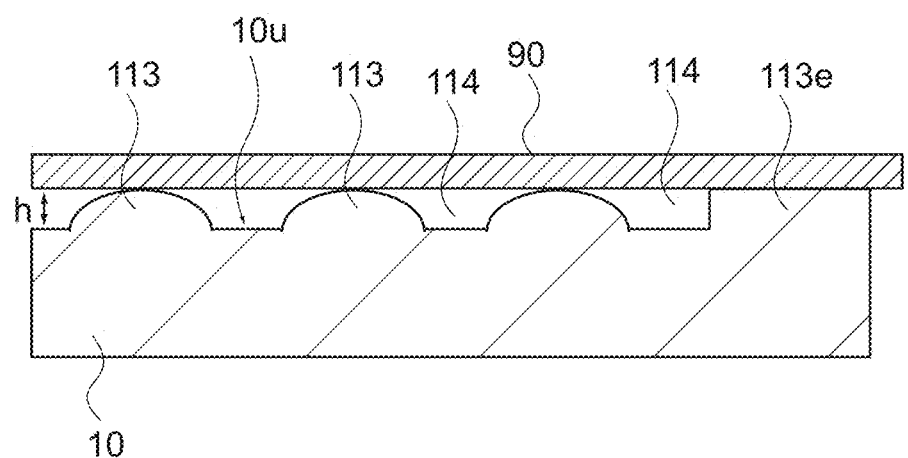
FIG. 2(b) is a schematic cross-sectional view of a region surrounded by a dashed line a2 in FIG. 1(b).

FIG. 1(a) is a schematic plan view of an electrostatic chuck according to this embodiment. FIG. 1(b) is a schematic cross-sectional view taken along the line A-A' in FIG. 1(a). FIG. 2(a) is a schematic cross-sectional view of a region surrounded by a dashed line a1 in FIG. 1(b). FIG. 2(b) is a schematic cross-sectional view of a region surrounded by a dashed line a2 in FIG. 1(b).

In FIG. 1(a), a substrate 90 is not shown to show the plane of an electrostatic chuck 1. FIG. 1(b) to FIG. 2(b) show the substrate 90 placed on the electrostatic chuck 1.

The electrostatic chuck 1 is, for example, an electrostatic chuck that adsorbs and holds the substrate 90 to be processed in a vacuum chamber. The electrostatic chuck 1 includes the chuck plate 10 and a chuck base 20. The substrate 90 is, for example, a semiconducting wafer.

The chuck plate 10 has an upper surface 10u (first surface) supporting the substrate 90 and a lower surface 10d (second surface) opposite to the upper surface 10u. The planar shape of the chuck plate 10 is not particularly limited, but is, for example, a circular shape. The chuck plate 10 is an elastic member, and is formed of, for example, a dielectric resin (e.g., silicone).

The chuck plate 10 includes an exhaust passage 100 on the upper surface 10u and inside the chuck plate 10. In the case where the substrate 90 is supported by the upper surface 10u, a gas emitted from the substrate 90 between the substrate 90 and the upper surface 10u is exhausted by the exhaust passage 100 from a space between the substrate 90 and the upper surface 10u.

The exhaust passage 100 includes a groove 110 provided on the upper surface 10u of the chuck plate 10 and a through hole 120 (first through hole) communicating with the groove 110.

The groove 110 includes a plurality of groove portions 111 (first groove portions) and a plurality of groove portions 112a, 112b, and 112c (second groove portions) intersecting the plurality of groove portions 111. The planar shape of the groove 110 is not limited to the illustrated example.

The plurality of groove portions 111 extends radially from the center of the chuck plate 10 toward the outside of the chuck plate 10. The plurality of groove portions 111 is arranged, for example, at equal intervals around the center of the chuck plate 10. Each of the plurality of groove portions 111 communicates with the through hole 120 disposed near the center of the chuck plate 10 and the through hole 120 disposed near the outer periphery of the chuck plate 10. In addition, each of the plurality of groove portions 111 traverses the groove portion 112b and communicates with the groove portion 112b.

Each of the plurality of groove portions 112a, 112b, and 112c is annularly formed around the center of the chuck plate 10. In the plurality of groove portions 112a, 112b, and 112c, the groove portion 112a is disposed near the center of the chuck plate 10 and the groove portion 112c is disposed near the outer periphery of the chuck plate 10. The groove portion 112b is disposed between the groove portion 112a and the groove portion 112c.

The groove portion 112a communicates with the plurality of through holes 120 disposed near the center of the chuck plate 10. The groove portion 112c communicates with the plurality of through holes 120 disposed near the outer periphery of the chuck plate 10. The groove portion 112b communicates with the plurality of groove portions 111.

At least a part of the upper surface 10u of the chuck plate 10, e.g., the entire region, is subjected to convex-shape embossing (FIG. 2(b)). In FIG. 1(a), a region 10E in which the upper surface 10u is embossed is indicated by a dashed line. By this embossing, a plurality of convex portions 113 is formed on the upper surface 10u. Each of upper surfaces of the plurality of convex portions 113 has an upward convex curved surface. A height h of the plurality of convex portions 113 from the upper surface 10u is made less than the depth of the groove portion 111 from the upper surface 10u.

For example, in the case where the substrate 90 is not supported on the chuck plate 10, the height h of the convex portion 113 is 30 µm or more and 150 µm or less. The pitch of the plurality of convex portions 113 is 100 µm or more and 500 µm or less. Since the chuck plate 10 is an elastic member, this height h is changed by the attractive force by which the chuck plate 10 attracts the substrate 90. For example, as the attractive force increases, the convex portions 113 and 113e are collapsed and the height h decreases.

Further, when the substrate 90 is supported on the upper surface 10u, a trough portion 114 of the adjacent convex portions 113 in the plane of the chuck plate 10 communicates with one of the groove portions 111, 112a, 112b, and 112c.

Further, the convex portion 113e that is in contact with the substrate 90 is formed on the outer periphery of the chuck plate 10. The height of the convex portion 113e is the same as the height of the convex portion 113. In the case where the convex portion 113e is viewed from above in the Z-axis direction, it has a circular ring shape. That is, the plurality of convex portions 113 is surrounded by the convex portion 113e. The height of the plurality of convex portions 113 from the upper surface 10u is made less than or equal to the height of the annular convex portion 113e from the upper surface 10u. In other words, when the substrate 90 is supported on the chuck plate 10, the space formed by the convex portion 113 and the trough portion 114 is shielded by the substrate 90 and the convex portion 113e.

The through hole 120 passes through from the upper surface 10u to the lower surface 10d. The plurality of through holes 120 is aligned in a column shape from the center of the chuck plate 10 toward the outside of the chuck plate 10. Further, the plurality of through holes 120 is arranged, for example, at equal intervals, around the center of the chuck plate 10. For example, the plurality of through holes 120 is arranged at 60° intervals around the center of the chuck plate 10.

The chuck base 20 has an upper surface 20u (third surface) facing the lower surface 10d of the chuck plate 10 and a lower surface 20d (fourth surface) opposite to the upper surface 20u. The upper surface 20u and the lower surface 10d of the chuck plate 10 are joined to each other by an adhesive layer 80. The planar shape of the chuck base 20 is, for example, a circular shape. The outer diameter of the chuck base 20 may be the same as the outer diameter of the chuck plate 10 or may be greater than the outer diameter of the chuck plate 10. The upper surface 20u of the chuck base 20 is, for example, a flat surface.

The chuck base 20 includes a through hole 220 (second through hole) penetrating from the upper surface 20u to the lower surface 20d. When the chuck plate 10 is fixed to the chuck base 20, the through hole 220 communicates with the through hole 120. The through hole 220 functions also as a screw hole in which a screw is disposed. The chuck base 20 is formed of, for example, aluminum or stainless steel.

The exhaust passage 100 in the electrostatic chuck 1 includes the groove 110 and the through hole 120 provided in the chuck plate 10, and the through hole 220 provided in the chuck base 20. Each of the plurality of through holes 220 does not necessarily need to pass through from the upper surface 20u of the chuck base 20 to the lower surface 20d. For example, a passage in which at least two of the plurality of through holes 220 merge and pass to the lower surface 20d may be provided inside the chuck base 20.

Further, the upper surface 20u of the chuck base 20 is provided with electrodes 40 and 41 aligned in the in-plane direction of the upper surface 20u. An insulating layer 81 is provided between the electrodes 40 and 41 and the chuck base 20, and the electrodes 40 and 41 and the chuck base 20 are kept insulated from each other. For example, a DC voltage is applied between the electrode 40 and the electrode 41 by a power source 42 provided outside. As a result, an electrostatic force for attracting the substrate 90 is generated on the upper surface 10u of the chuck plate 10, and the substrate 90 is adsorbed and held on the upper surface 10u. Further, the chuck base 20 may be provided with also a temperature regulating mechanism for regulating the temperature of the substrate 90.

Figure 3:
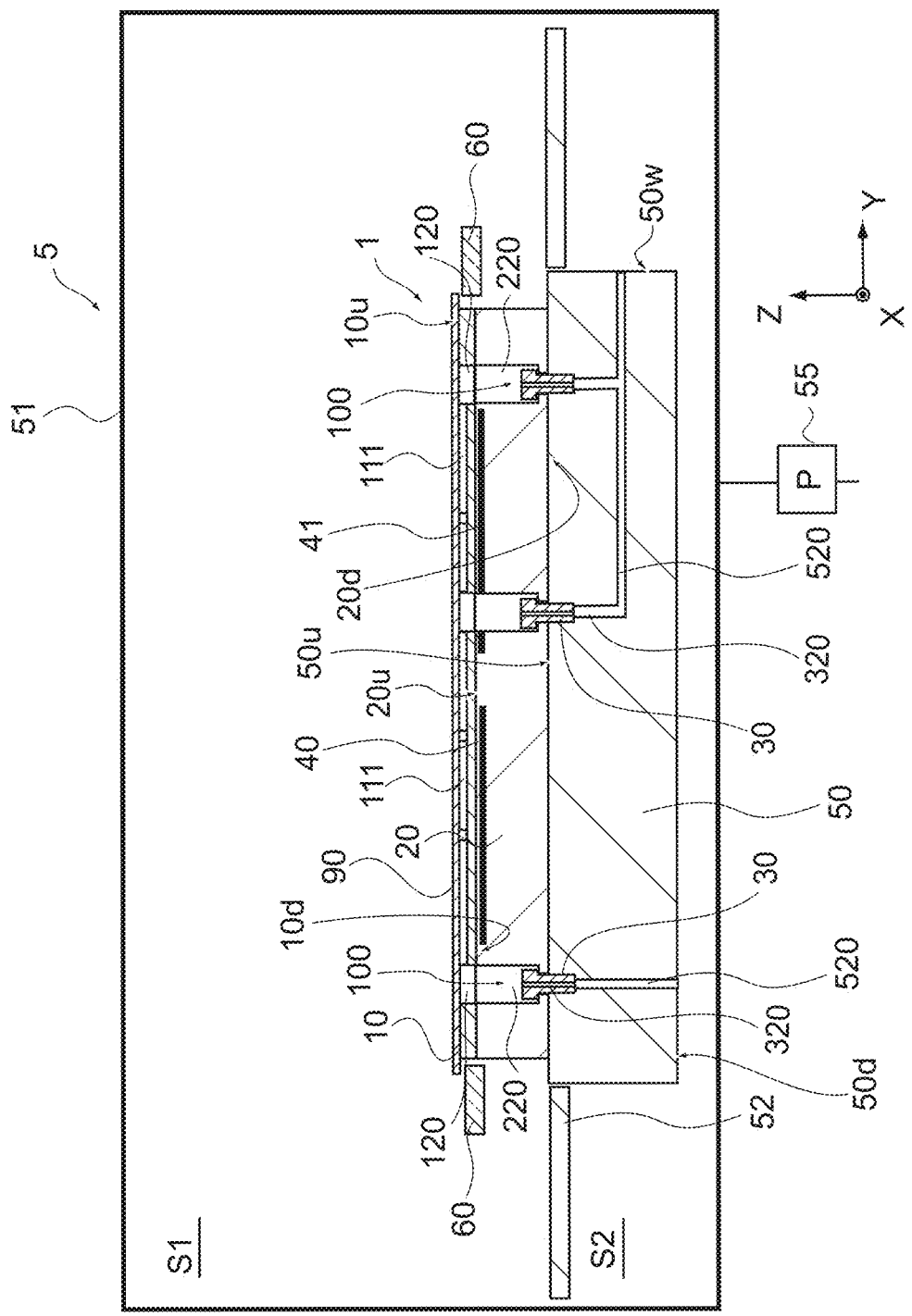
FIG. 3 is a schematic cross-sectional view of a vacuum processing apparatus according to this embodiment.

FIG. 3 is a schematic cross-sectional view of a vacuum processing apparatus according to this embodiment. FIG. 3 illustrates the electrostatic chuck 1 mounted to a support stage in a vacuum chamber.

A vacuum processing apparatus 5 includes a vacuum chamber 51, the electrostatic chuck 1, a support stage 50, an deposition shieled plate 52, an exhaust mechanism 55, and a conveying mechanism 60.

The vacuum chamber 51 is a vacuum chamber capable of maintaining a reduced pressure and houses the electrostatic chuck 1, the support stage 50, and the deposition shieled plate 52.

The support stage 50 has an upper surface 50u (fifth surface) supporting the electrostatic chuck 1, a lower surface 50d (sixth surface) opposite to the upper surface 50u, and a side surface 50w leading to the upper surface 50u and the lower surface 50d. The support stage 50 may be provided with a temperature regulating mechanism for regulating the temperature of the substrate 90.

The electrostatic chuck 1 is fixed to the support stage 50 by a screw 30 disposed in the through hole 220 of the chuck base 20.

The screw 30 is a so-called vent screw. For example, the screw 30 may be provided with a through hole 320 penetrating through the screw 30 along the centerline thereof. This through hole 320 also functions as a part of the exhaust passage 100.

The deposition shieled plate 52 surrounds the support stage 50 in the vacuum chamber 51. By disposing the deposition shieled plate 52, the inside of the vacuum chamber 51 is partitioned into a first region S1 (upper space) in which the electrostatic chuck 1 is disposed and a second region S2 (lower space) in which the support stage 50 is disposed.

The support stage 50 is provided with a through hole 520 that passes through from the upper surface 50u to the lower surface 50d or from the upper surface 50u to the side surface 50w and communicates with the exhaust passage 100. Since the through hole 520 is also provided as a different exhaust passage in the support stage 50, the emission gas guided through the exhaust passage 100 of the electrostatic chuck 1 is exhausted to the second region S2.

The conveying mechanism 60 is, for example, a conveying arm, locks the outer periphery of the substrate 90, and raises the substrate 90 from the electrostatic chuck 1 or lowers the substrate 90 toward the electrostatic chuck 1. Further, the conveying mechanism 60 is capable of carrying out the substrate 90 raised from the electrostatic chuck 1 from the vacuum chamber 10, or carry the substrate 90 into the vacuum chamber 10. Note that for raising and lowering the substrate 90, so-called push-up pins may be used.

Further, the vacuum processing apparatus 5 may be provided with a rotating mechanism for causing the support stage 50 to rotate, a lifting mechanism for raising and lowering the support stage 50, and the like. Further, the vacuum processing apparatus 5 may be provided with an exhaust mechanism for exhausting the first region S1, in addition to the exhaust mechanism 55.

The vacuum processing apparatus 5 is applied to, for example, sputtering, chemical vapor deposition, or ion implantation. In this embodiment, as an example, an example in which the vacuum processing apparatus 5 is applied to an end station of an ion implanter is shown.

Figure 4:
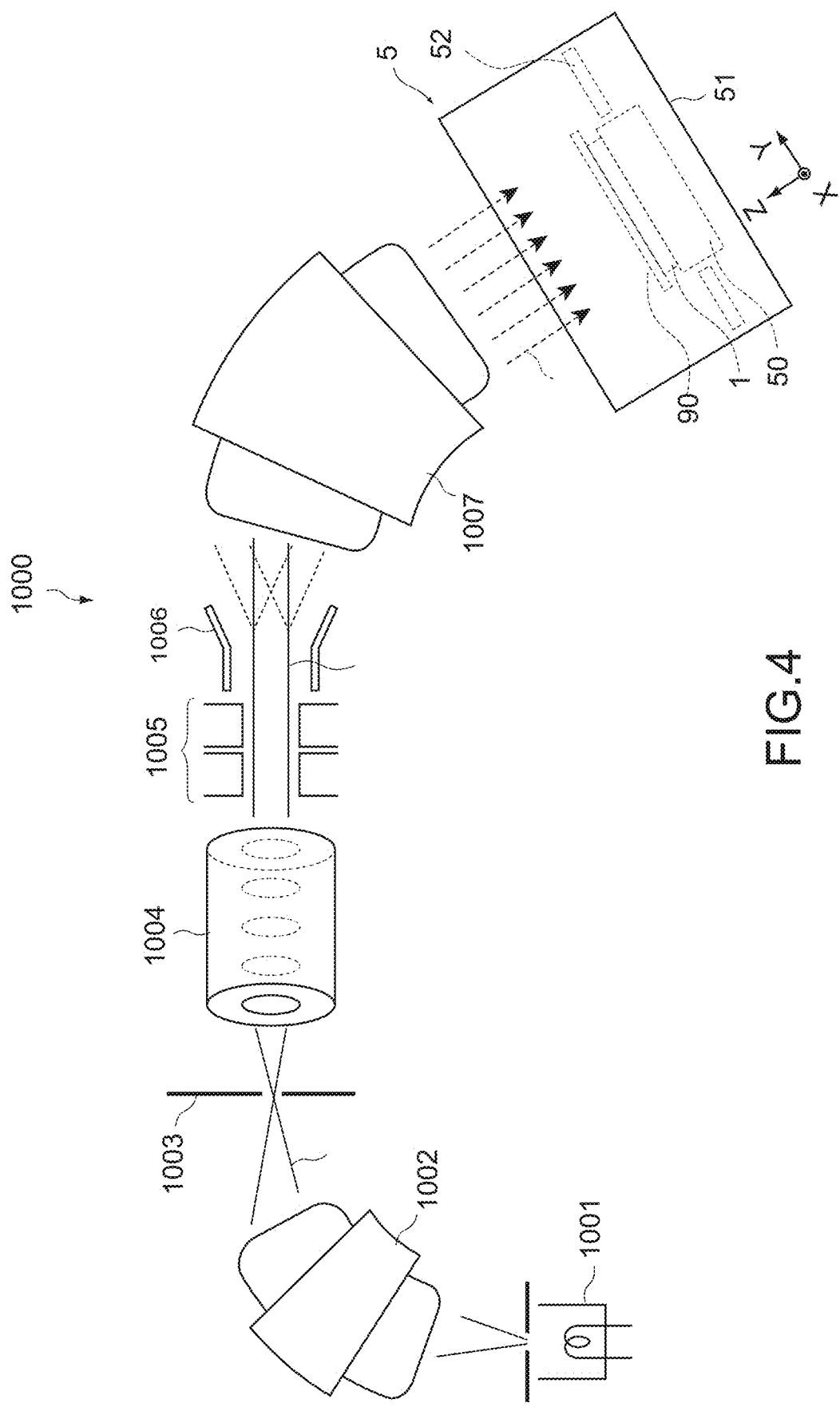
FIG. 4 is a block configuration diagram of an ion implanter.

FIG. 4 is a block configuration diagram of an ion implanter.

An ion implanter 1000 includes an ion source 1001, a mass spectrometer 1002, a mass spectrometry slit 1003, an acceleration tube 1004, a quadrupole lens 1005, a scanner 1006, a parallelizer 1007, and the vacuum processing apparatus 5 that is an end station.

The ion source 1001 generates ions. The mass spectrometer 1002 utilizes the nature of charged particles such as ions and electrons to be deflected in a magnetic or electric field to generate a magnetic or electric field, or both of them, thereby to identify the ionic species that is desired to be implanted into the substrate 90. The acceleration tube 1004 accelerates or decelerates the desired ionic species that has passed through the mass spectrometry slit 1003. The acceleration tube 1004 applies a high voltage to a plurality of electrode pairs to accelerate or decelerate ions to desired implantation energies by the effect of an electrostatic field. The quadrupole lens 1005 adjusts the beam-shape of the ions that have passed through the acceleration tube 1004.

The scanner 1006 generates a uniform external electric field in a direction perpendicular to the traveling direction of the beam-shaped ions C that have passed through the quadrupole lens 1005, and controls the deflection angle of the ions by changing the polarity and intensity of this electric field. The scanner 1006 scans the ion beam in a predetermined direction toward the input stage of the parallelizer 1007. The parallelizer 1007 suppresses the spread of the ion beam and forms an ion beam that is scanned uniaxially, the ion beam entering the surface of the substrate 90. The parallelizer 1007 functions as a beam scanner that scans the ion beam in one axial direction. The substrate 90 housed in the vacuum processing apparatus 5 is irradiated with the ion beam.

The effect of the electrostatic chuck 1 according to this embodiment will be described.

Figure 5A:
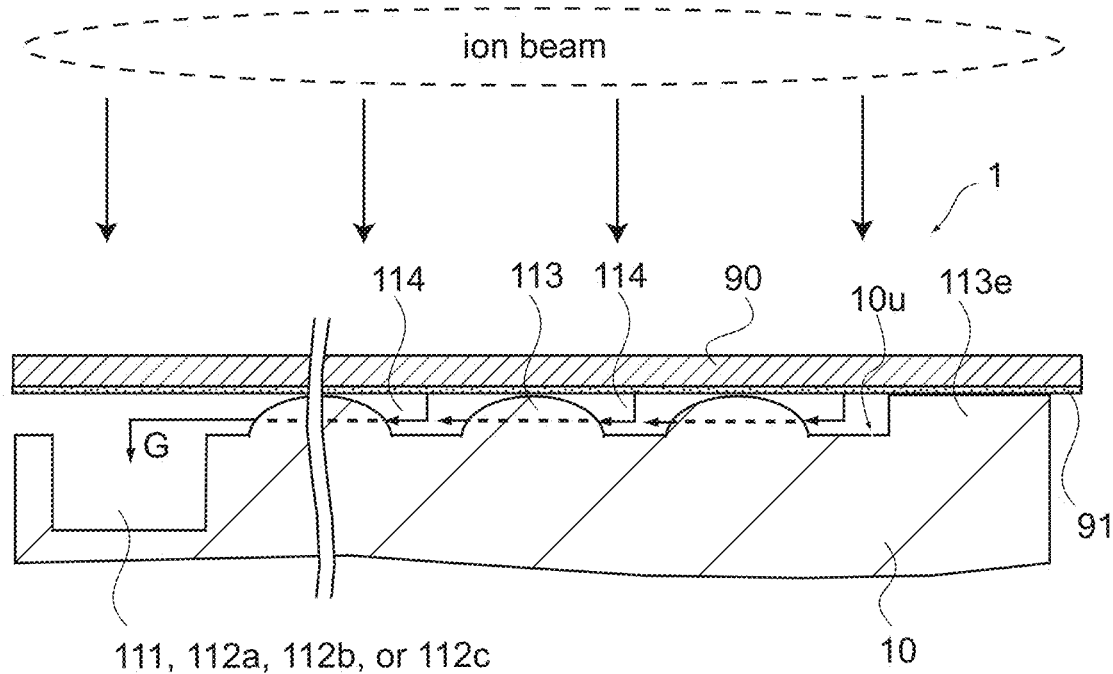
FIGS. 5(a) and 5(b) are each a schematic cross-sectional view describing an example of the effect of the electrostatic chuck.
Figure 5B:
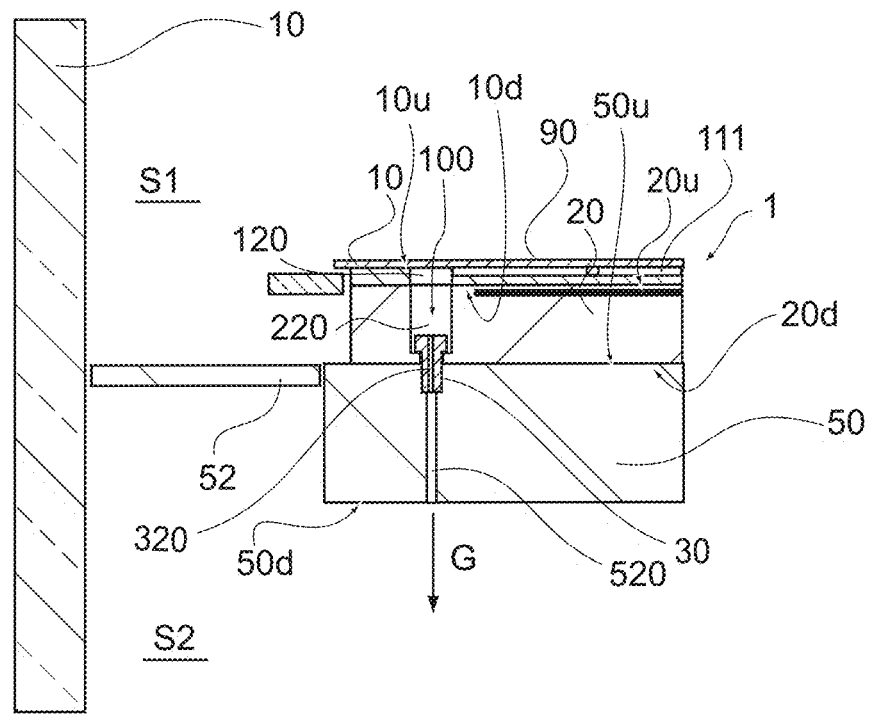

FIGS. 5(a) and 5(b) are each a schematic cross-sectional view describing an example of the effect of the electrostatic chuck.

A wafer process is applied to the surface of the substrate 90 to form an element. Further, as part of the wafer process, ion implantation may be performed on the back surface of the substrate 90. In this embodiment, ion implantation into the back surface is assumed, and the substrate surface on the side supported by the chuck plate 10 is the front surface of the substrate 90, and the surface opposite thereto is the back surface of the substrate 90.

In this case, because the front surface of the substrate 90 on which the element has been formed is in contact with and supported by the chuck plate 10, a protective layer 91 such as a resist is applied to the front surface of the substrate 90 (FIG. 5(a)).

When ion implantation is performed on the back surface of the substrate 90 in this condition, the substrate 90 is warmed by ion irradiation, and gases such as water vapor and carbonized gas are emitted from the protective layer 91.

Here, a phenomenon that can occur in the case where the exhaust passage 100 and the convex portions 113 and 113e are not provided in the electrostatic chuck 1 will be considered.

In this case, the substrate 90 is firmly pressed against the chuck plate 10 by electrostatic adsorption. In addition, for the emission gas, there is no escape route such as the exhaust passage 100. Therefore, gases generated from the protective layer 91 by ion implantation tend to remain between the substrate 90 and the chuck plate 10.

If the electrostatic adsorption of the substrate 90 is released after the ion implantation is completed, the emission gas accumulated between the substrate 90 and the chuck plate 10 can rapidly expand, causing the substrate 90 to jump out of the chuck plate 10. As a result, even if the ion implantation is successfully completed, there is a possibility that the conveyance of the substrate 90 may be defective thereafter, or the front surface of the substrate 90 may be damaged.

Further, in the case where the emission gas accumulated between the substrate 90 and the chuck plate 10 during the ion implantation leaks into the first region S1, the ion beam is exposed to the emission gas. This changes the direction of the ion beam, neutralizes the ions, or reduces the energy of the ion beam.

Meanwhile, FIG. 5(a) shows the effect in the case where the electrostatic chuck 1 according to this embodiment is used.

As described above, when ion implantation is performed on the back surface of the substrate 90, the substrate 90 is warmed by the ion irradiation on the back surface, and a gas is emitted from the protective layer 91. However, in the case where the electrostatic chuck 1 is used, during the electrostatic adsorption, the space between the chuck plate 10 and the substrate 90 is sealed by the convex portion 113e provided on the outer periphery of the chuck plate 10. As a result, the emission gas is less likely to leak from the space between the substrate 90 and the chuck plate 10.

Meanwhile, even if the emission gas is accumulated between the chuck plate 10 and the substrate 90 without leaking, the plurality of convex portions 113 is aligned spaced apart on the upper surface 10u of the chuck plate 10. For this reason, the emission gas flows to the lower surface 10d side of the chuck plate 10 through the trough portion 114 between the adjacent convex portions 113 and the groove portions 111 and 112a to 112c via the through hole 120.

Further, the through hole 120 communicates with the through hole 220 of the chuck base 20. As a result, the emission gas is efficiently exhausted from the upper surface 20u of the chuck base 20 toward the lower surface 20d. The flow of the emission gas is simply represented by an arrow G in FIG. 5(a).

Further, even if the electrostatic chuck 1 is mounted to the support stage 50, since the through hole 220 of the chuck base 20 communicates with the through hole 520 of the support stage 50 and the screw 30 is provided with the through hole 320, the emission gas is efficiently exhausted from the upper surface 50u of the support stage 50 toward the lower surface 50d through the through hole 320 and the through hole 520 (FIG. 5(b)).

In particular, the substrate 90 and the lower surface 50d of the support stage 50 are separated from each other by the deposition shieled plate 52. Further, the second region S2 is evacuated by the exhaust mechanism 55. Therefore, the gases emitted to the second region S2 are exhausted by the exhaust mechanism 55 in the second region S2. This makes it difficult for the emission gas to leak to the first region S1.

As described above, in accordance with this embodiment, even if the ion implantation step is completed and the electrostatic adsorption is released, a gas hardly remains between the substrate 90 and the chuck plate 10. This avoids the phenomenon that the substrate 90 jumps out of the chuck plate 10 due to the rapid volume expansion of the emission gas. Further, since the emission gas is hardly leaked to the first region S1, the direction of the ion beam is not changed, the ions are not neutralized, and the energy of the ion beam is not reduced.

Further, since the gas emitted from the protective layer 91 by ion implantation is naturally exhausted out of the vacuum chamber 51 through the exhaust passage 100, the degassing processing (annealing treatment) of the protective layer 91 is unnecessary. That is, the use of the electrostatic chuck 1 improves the productivity of the wafer process.

Further, in order to more reliably peel the substrate 90 from the electrostatic chuck 1 due to gas expansion between the substrate 90 and the chuck plate 10 and evacuate the emission gas, the processing method described below may be applied.

FIGS. 6(a)-6(d) are each a schematic cross-sectional view showing an example of a substrate processing method.

Figure 6A:
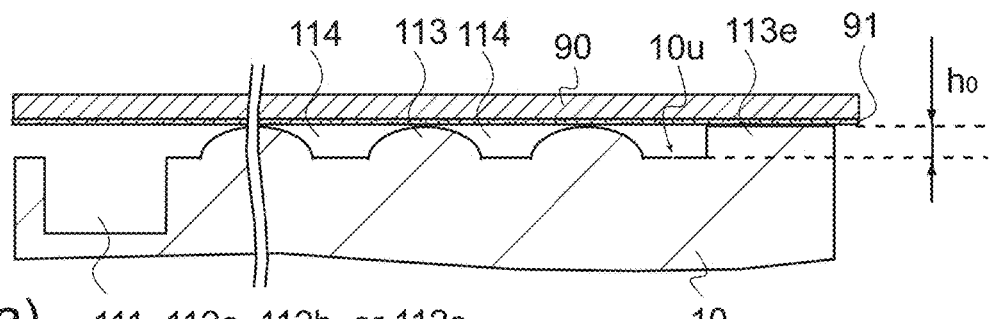
FIGS. 6(a)-6(d) are schematic cross-sectional views showing an example of a substrate processing method.

For example, as shown in FIG. 6(a), the electrostatic chuck 1 is prepared, and the substrate 90 is placed on the upper surface 10u thereof. The height of the convex portion 113 in this condition is defined as $h_0$.

Figure 6B:
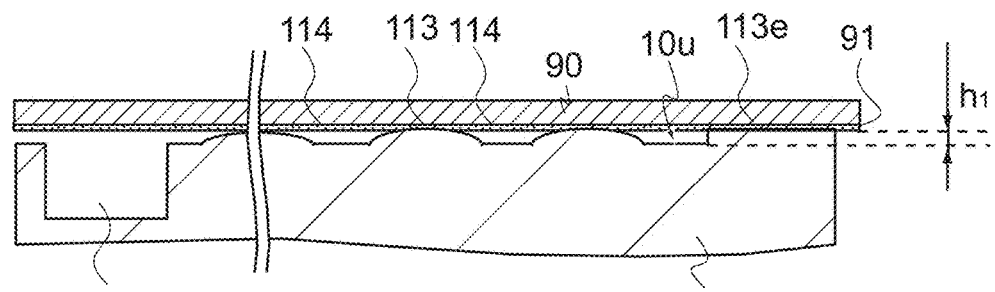

Next, as shown in FIG. 6(b), the substrate 90 is electrostatically adsorbed on the upper surface 10u. As a result, the convex portions 113 and 113e are collapsed, and the height of the convex portion 113 is adjusted to a height $h_1$ lower than the height $h_0$. The electrostatic attraction force at this time is adjusted to such an extent that the substrate 90 is not surely peeled from the chuck plate 10 even if the substrate 90 is processed.

Figure 6C:
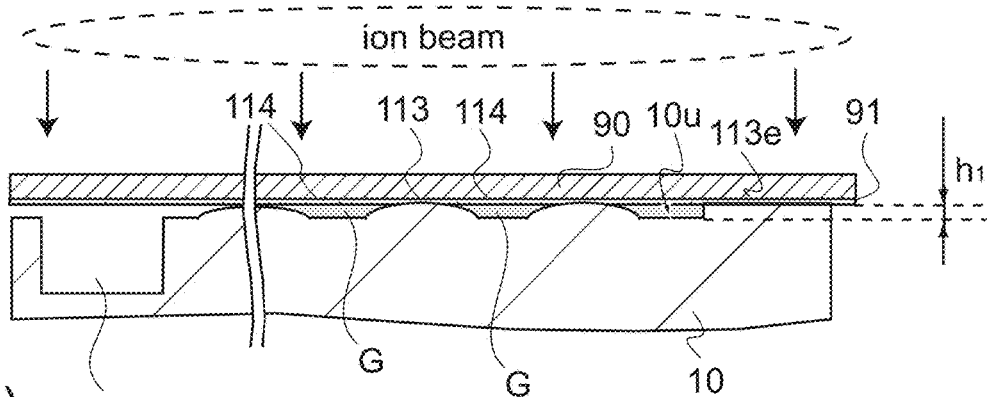

Next, as shown in FIG. 6(c), processing such as ion implantation is performed on the substrate 90. At this time, a gas G is emitted from the protective layer 91. The emission gas G is exhausted through the exhaust passage 100 and the through hole 520 to the second region S2. However, since the height of the convex portion 113 is the height $h_1$ lower than the height $h_0$, the trough portion 114 has a relatively low conductance.

For this reason, there is a possibility that a small amount of gas G remains between the substrate 90 and the chuck plate 10 during processing. When the electrostatic adsorption is released in this condition, there is a possibility that the substrate 90 jumps out of the chuck plate 10 due to the rapid volume expansion of the residual gases.

In order to avoid this, the emission gas G is exhausted from a space between the substrate 90 and the upper surface 10u of the chuck plate 10 while relaxing the electrostatic adsorption without abruptly releasing the electrostatic adsorption after the processing is finished.

Figure 6D:
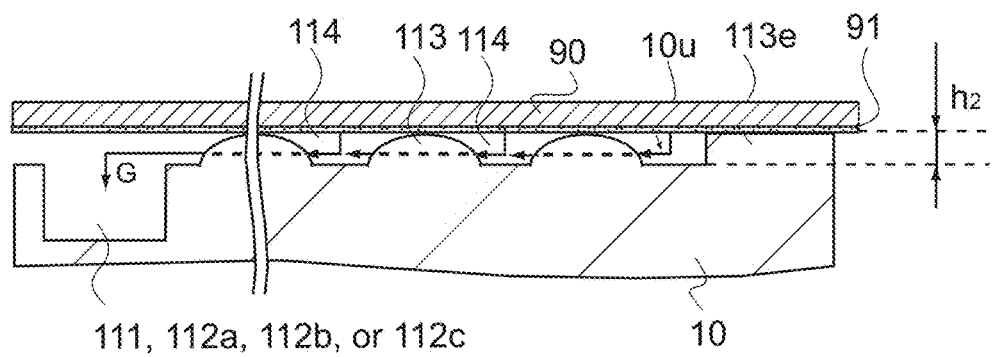

For example, as shown in FIG. 6(d), the height is adjusted to be $h_2$ ($h_1 \leq h_2 \leq h_0$) by adjusting the electrostatic adsorption weaker than that when the height is $h_1$. The height may be changed from the height $h_1$ to $h_2$ in a continuous manner or in a stepwise manner.

As a result, the capacitance of the trough portion 114 rises more than that when the height is $h_1$, and the conductance of the trough portion 114 rises. As a result, the gas G emitted during processing is reliably evacuated from a space between the substrate 90 and the upper surface 10u of the chuck plate 10. After that, the electrostatic adsorption is released and the substrate 90 is conveyed by the conveying mechanism 60.

Alternatively, after the ion implantation illustrated in FIG. 6(c) is completed, the electrostatic adsorption may be relaxed in a continuous manner or in a stepwise manner and released until the height is $h_0$ or close to $h_0$.

In accordance with such a substrate processing method, the rapid volume expansion due to the emission gas is suppressed even if the electrostatic adsorption is released, and the substrate 90 can be inhibited from jumping out of the chuck plate 10.

Modified Example

Figure 7:
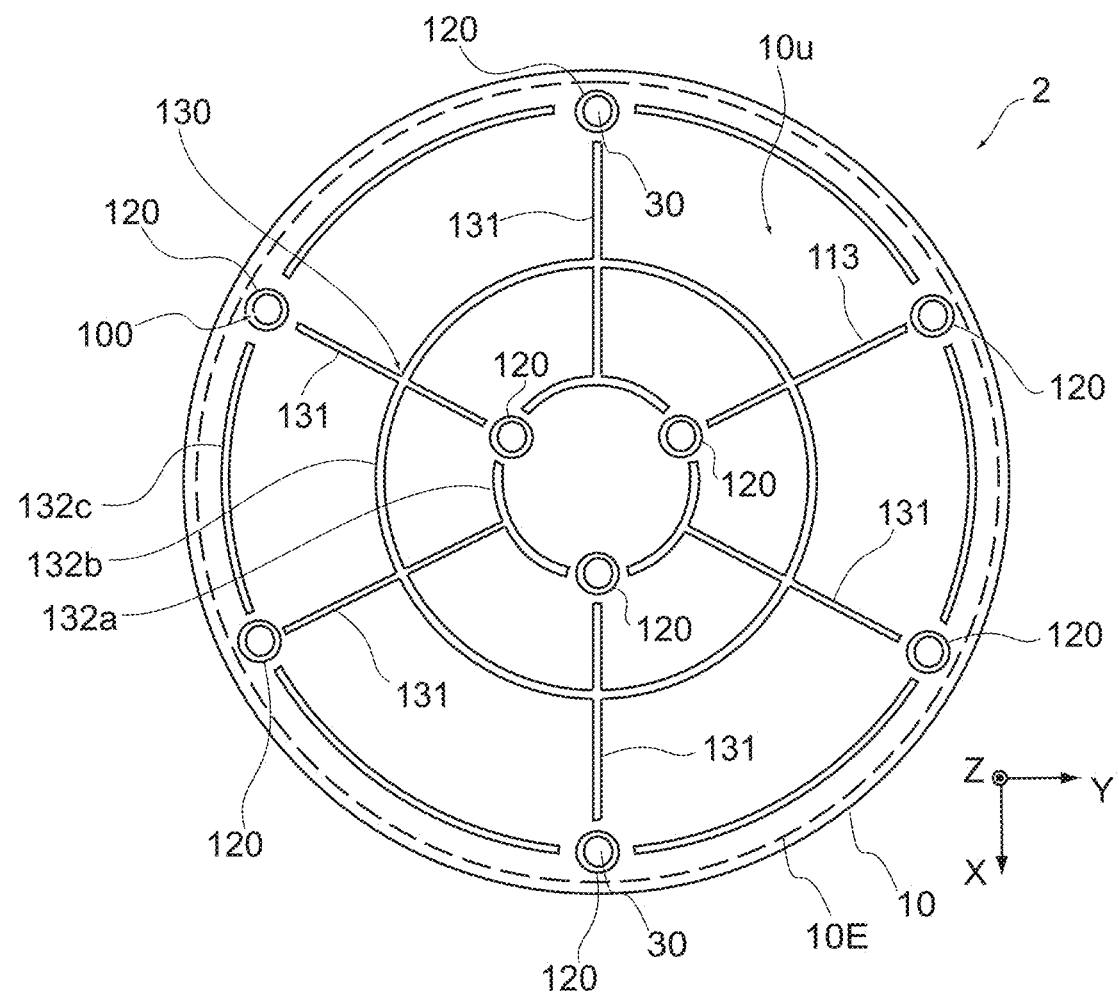
FIG. 7 is a schematic plan view of an electrostatic chuck according to a modified example of this embodiment.

FIG. 7 is a schematic plan view of an electrostatic chuck according to a modified example of this embodiment.

In an electrostatic chuck 2, the exhaust passage 100 includes a linear embanked portion 130 provided on the upper surface 10u, and the through hole 120.

The embanked portion 130 includes a plurality of embanked portions 131 (first embanked portions) and a plurality of embanked portions 132a, 132b, and 132c (second embanked portions). Each of the plurality of embanked portions 131 (first embanked portions) extends from the center of the chuck plate 10 outwardly of the chuck plate 10. The plurality of embanked portions 132a, 132b, and 132c intersects the plurality of embanked portions 131 and is annularly formed around the center of the chuck plate 10. The height of the plurality of embanked portions 131 and the plurality of embanked portions 132a, 132b, and 132c from the upper surface 10u is made less than or equal to the height of the convex portion 113e.

Even in such a configuration, the emission gas G is submerged between the substrate 90 and the chuck plate 10 and reaches one of the through holes 120. Then, the emission gas G is exhausted from a space between the substrate 90 and the chuck plate 10 via the through hole 120.

Although an embodiment of the present invention has been described above, it goes without saying that the present invention is not limited to the above-mentioned embodiment and various modifications may be made. Each embodiment is not limited to an independent form, and can be combined as much as technologically possible.

REFERENCE SIGNS LIST 1, 2 electrostatic chuck
1a, 2a dashed line
5 vacuum processing apparatus
10 chuck plate
100 exhaust passage
10E region
10d, 20d, 50d lower surface
10u, 20u, 50u upper surface
110 groove
111, 112a, 112b, 112c groove portion
113, 113e convex portion
114 trough portion
120, 220, 320, 520 through hole
130, 131, 132a, 132b, 132c embanked portion
20 chuck base
30 screw
40,41 electrode
42 power source
50 support stage
50w side surface
51 vacuum chamber
52 deposition shieled plate
55 exhaust mechanism
60 conveying mechanism
80 adhesive layer
81 insulating layer
90 substrate
91 protective layer
1000 ion implanter
1001 ion source
1002 mass spectrometer
1003 mass spectrometry slit

The invention claimed is:

1. An electrostatic chuck, comprising:
a chuck plate that has a first surface supporting a substrate and a second surface opposite to the first surface, and includes an exhaust passage that exhausts a gas emitted from the substrate from between the substrate and the first surface when the substrate is supported by the first surface,
wherein the chuck plate is an elastic member,
wherein the first surface is provided with a plurality of convex portions and an annular convex portion that surrounds the plurality of convex portions,
wherein a height $h_0$ of the plurality of convex portions from the first surface is less than or equal to a height of the annular convex portion, and
wherein the height $h_0$ of the plurality of convex portions from the first surface is capable of being adjusted to a height $h_1$ lower than the height $h_0$ by electrostatically adsorbing the substrate to the first surface when the substrate is placed on the first surface provided with the plurality of convex portions.

2. The electrostatic chuck according to claim 1, wherein the exhaust passage includes
a groove provided in the first surface and
a first through hole that communicates with the groove and passes through from the first surface to the second surface.

3. The electrostatic chuck according to claim 2, wherein the groove includes
a plurality of first groove portions that extends from a center of the chuck plate outwardly of the chuck plate, and
a plurality of second groove portions that intersects the plurality of first groove portions and is annularly formed around the center of the chuck plate.

4. The electrostatic chuck according to claim 1, wherein the exhaust passage includes
a linear embanked portion provided on the first surface and
a first through hole that passes through from the first surface to the second surface.

5. The electrostatic chuck according to claim 1, further comprising
a chuck base that has a third surface and a fourth surface, the third surface facing the second surface of the chuck plate, the fourth surface being opposite to the third surface,
wherein the chuck base is provided with a second through hole that passes through from the third surface to the fourth surface, and the second through hole is configured to communicate with the first through hole.

6. A vacuum processing apparatus, comprising:
a vacuum chamber;
an electrostatic chuck including
a chuck plate that has a first surface supporting a substrate and a second surface opposite to the first surface, and includes an exhaust passage that exhausts a gas emitted from the substrate from between the substrate and the first surface when the substrate is supported by the first surface;
a support stage that is housed in the vacuum chamber and has a fifth surface and a sixth surface, the fifth surface supporting the electrostatic chuck, the sixth surface being opposite to the fifth surface; and
a deposition shieled plate that surrounds the support stage and partitions an inside of the vacuum chamber into a first region and a second region, the electrostatic chuck being disposed in the first region, the support stage being disposed in the second region,
wherein the support stage is provided with a different exhaust passage that exhausts the gas guided through the exhaust passage to the second region,
wherein the chuck plate is an elastic member,
wherein the first surface is provided with a plurality of convex portions and an annular convex portion that surrounds the plurality of convex portions,
wherein a height $h_0$ of the plurality of convex portions from the first surface is less than or equal to a height of the annular convex portion, and
wherein the height $h_0$ of the plurality of convex portions from the first surface is capable of being adjusted to a height $h_1$ lower than the height $h_0$ by electrostatically adsorbing the substrate to the first surface when the substrate is placed on the first surface provided with the plurality of convex portions.

* * * * *